(12) United States Patent  
Chen et al.

(10) Patent No.: US 9,006,058 B1  
(45) Date of Patent: Apr. 14, 2015

(54) METHOD FOR FABRICATING SEMICONDUCTOR DEVICE

(71) Applicant: United Microelectronics Corp., Hsinchu (TW)

(72) Inventors: Tung-Ming Chen, Kaohsiung (TW); Yu-Chun Huang, Tainan (TW); Shin-Chuan Huang, Tainan (TW); Chia-Jong Liu, Pingtung County (TW); I-Fang Huang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/150,489

(22) Filed: Jan. 8, 2014

(51) Int. Cl.  
*H01L 21/8238* (2006.01)  
*H01L 29/66* (2006.01)

(52) U.S. Cl.  
CPC *H01L 21/823814* (2013.01); *H01L 21/823864* (2013.01); *H01L 29/6659* (2013.01); *H01L 29/6656* (2013.01); *H01L 29/6653* (2013.01); *H01L 29/66628* (2013.01); *H01L 21/8238* (2013.01)

(58) Field of Classification Search  
CPC .................................................. H01L 21/8232  
See application file for complete search history.

(56) References Cited

U.S. PATENT DOCUMENTS

2007/0034906 A1    2/2007   Wang et al.

*Primary Examiner* — Cheung Lee  
(74) *Attorney, Agent, or Firm* — J.C. Patents

(57) ABSTRACT

A method for fabricating a semiconductor device is described. A semiconductor substrate is provided, wherein the substrate has a first area and a second area. A first gate structure and a second gate structure are formed over the substrate in the first area and the substrate in the second area, respectively. A first spacer is framed on the sidewall of each gate structure. At least one etching process including at least one wet etching process is performed. The first spacer is removed. A second spacer is formed on the sidewall of each gate structure. A mask layer is formed in the second area. Ion implantation is formed using the mask layer, the first gate structure and the second spacer as a mask to form S/D extensions in the substrate beside the first gate structure in the first area. The mask layer is then removed.

12 Claims, 3 Drawing Sheets

METHOD FOR FABRICATING SEMICONDUCTOR DEVICE

BACKGROUND OF THE INVENTION

1. Field of Invention

This invention relates to a semiconductor process, particularly to a method for fabricating a semiconductor device.

2. Description of Related Art

In a conventional process for fabricating strained MOS transistors, a disposable silicon nitride (Dis-SiN) layer is formed covering a NMOS area but exposing a PMOS area to be formed with a stress layer, and is removed after the stress layer is formed. In addition, a thin spacer is usually formed on the sidewall of the NMOS gate before the Dis-SiN layer is formed, which is capable of controlling the overlap width of the later formed NMOS source/drain (S/D) extensions with the NMOS gate. This overlap width will affect the electrical characteristics of the semiconductor device.

However, in the formation of the NMOS S/D extensions after the stress layer is formed, the thin spacer usually has been damaged in the profile or thickness by the prior etching step(s), so the uniformity of the devices is lowered. In addition, in the removal of the Dis-SiN layer, the exposed substrate surface is easily damaged, which may cause some problems in the device reliability and performance.

SUMMARY OF THE INVENTION

Accordingly, this invention provides a method for fabricating a semiconductor device, which is at least capable of improving the uniformity of the devices.

The method for fabricating a semiconductor device of this invention is described as follows. A semiconductor substrate is provided, wherein the substrate has a first area and a second area. A first gate structure and a second gate structure are formed over the substrate in the first area and the substrate in the second area, respectively. A first spacer is formed on the sidewall of each of the first and the second gate structures. At least one etching process including at least one wet etching process is performed. The first spacer is removed. A second spacer is formed on the sidewall of each of the first and the second gate structures. A mask layer is formed in the second area. Ion implantation is performed using the mask layer, the first gate structure and the second spacer as a mask to form S/D extensions beside the first gate structure in the substrate in the first area. The mask layer is then removed.

Because the second spacer is formed on the sidewall of the first gate structure to replace the first spacer having been damaged by etching, the overlap width of the first gate structure and the S/D extensions can be well controlled to improve the uniformity of the devices.

In some embodiments, a stress layer is formed in the substrate before the first spacer is removed. Moreover, a protective layer and a disposable layer may be foinied in the first area after the first spacer is formed but before the stress layer is formed. The disposable layer may be removed with another wet etching process after the stress layer is formed.

Because the protective layer is formed prior to the disposable layer, the substrate surface is protected from damages by the protective layer in removal of the disposable layer to avoid certain problems.

In order to make the aforementioned and other objects, features and advantages of the present invention comprehensible, a preferred embodiment accompanied with figures is described in detail below.

DESCRIPTION OF EMBODIMENTS

The following embodiment is intended to further explain this invention but not to limit the scope thereof. For example, though the stress layer is shown to be a single layer, it may alternatively be a 2- or 3-layer composite, such as a 3-layer composite including a first SiGe layer having a first Ge proportion, a second SiGe layer having a second Ge proportion, and a silicon layer at the top. Moreover, although the first transistor including the first gate structure is NMOS and the second transistor including the second gate structure is PMOS in the embodiment, it is also possible that the first transistor is PMOS and the second transistor is NMOS in other cases.

FIGS. 1-8 illustrate, in a cross-sectional view, a method for fabricating a semiconductor according to an embodiment of this invention.

Figure 1:
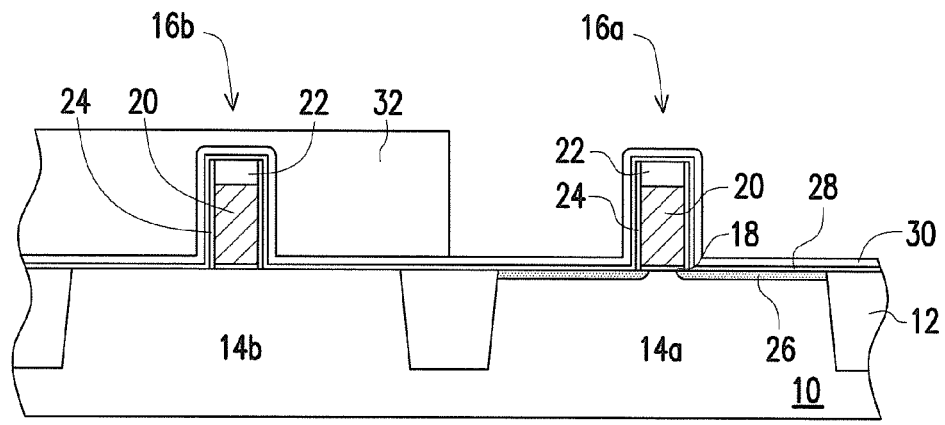
FIGS. 1-8 illustrate, in a cross-sectional view, a method for fabricating a semiconductor according to an embodiment of this invention.

Referring to FIG. 1, a semiconductor substrate 10 is provided, which may be a single-crystal silicon substrate or an epitaxial silicon substrate. An isolation layer 12 is formed in the substrate 10 to define a PMOS area 14a and a NMOS area 14b on the substrate 10. A gate structure 16a of the PMOS and a gate structure 16b of the NMOS are formed on the substrate 10 in the PMOS area 14a and the substrate 10 in the NMOS area 14b, respectively, wherein each gate structure 16a or 16b includes a stack of a gate dielectric layer 18, a gate conductor 20 and a cap layer 22, from bottom to top. The gate conductor 20 may include poly-Si. The cap layer 22 may include SiN.

Then, a spacer 24 is formed on the sidewall of each of the gate structures 16a and 16b. The spacer 24 may include silicon carbonitride (SiCN) or SiC, and may have a thickness of 5 to 50 Å. S/D extensions 26 of the PMOS are then formed in the substrate 10 beside the PMOS gate structure 16a through boron ion implantation.

A blanket protective layer 28 and a blanket disposable layer 30 are then formed in sequence, both of which are substantially conformal to the above resulting structure. The protective layer 28 may include silicon oxide formed with atomic layer deposition (ALD), namely ALD oxide, and may have a thickness of 3 to 40 Å. The disposable layer 30 may include SiN, and may have a thickness of 20 to 150 Å. A patterned photoresist layer 32 is then formed covering the NMOS area 14b.

Figure 2:
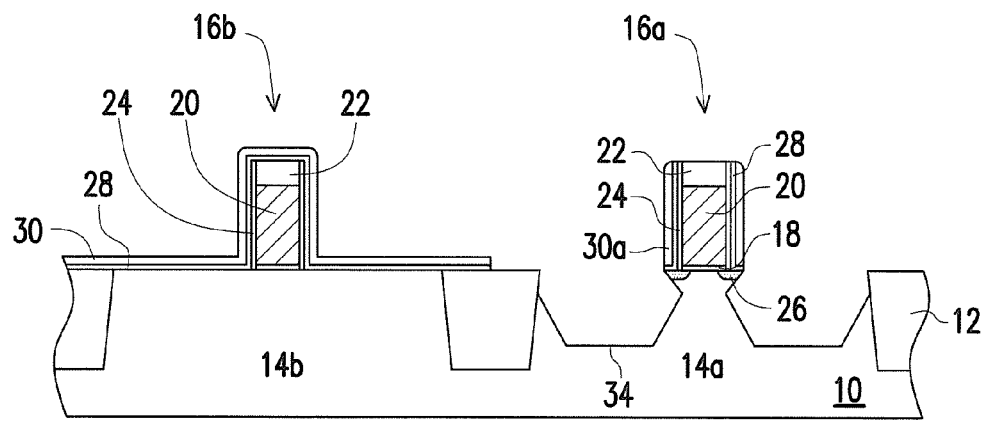

Referring to FIG. 2, an anisotropic etching is conducted using the patterned photoresist layer 32 as a mask to remove the horizontal portions of the disposable layer 30 and the protective layer 28 in the PMOS area 14a, leaving in the PMOS area 14a a spacer 30a (defined from the disposable layer 30) and a portion of the protective layer 28 on the sidewall of the PMOS gate structure 16a. The anisotropic etching is continued with the patterned photoresist layer 32, the PMOS gate structure 16a and the spacer 30a as a mask to remove a portion of the substrate 10 in the PMOS area 14a, so as to form cavities 34 in the substrate 10 beside the PMOS gate structure 16a in the PMOS area 14a. A wet etching process may be further performed to laterally expand each of the cavities 134. After that, the patterned photoresist layer 32 is removed. The protective layer 28 and the disposable layer 30 in the NMOS area 14b are not etched in the anisotropic etching process (and the wet etching process) due to the masking of the patterned photoresist layer 32.

Figure 3:
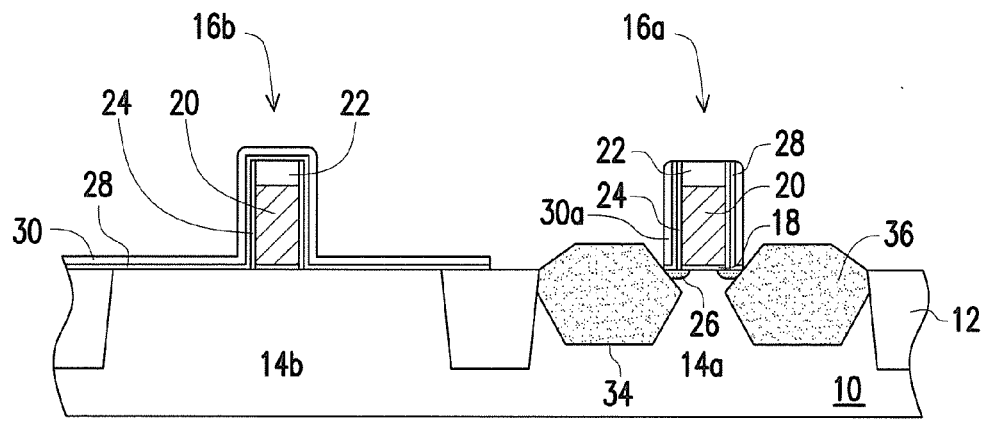

Referring to FIG. 3, a stress layer 36 is formed in each of the cavities 134. The stress layer 36 usually includes SiGe to produce a compression stress for the PMOS channel, and may be formed with an epitaxial process. The stress layer 36 is usually formed to protrude above the surface level of the substrate 10.

Figure 4:
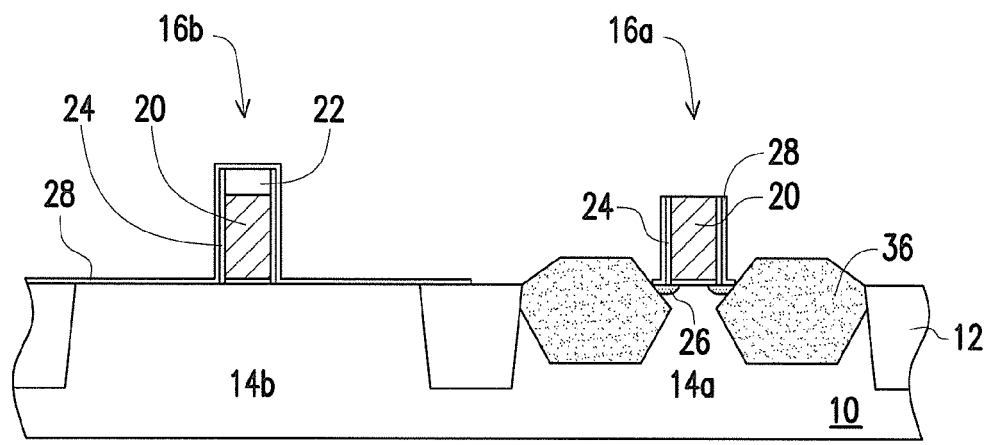

Referring to FIG. 4, the disposable layer 30 and the cap layer 22 of the PMOS gate structure 16a are removed, possibly using phosphoric acid, while the cap layer 22 of the NMOS gate structure 16b is not removed due to protection by the protective layer 28. It is noted that the temperature set in the removal process cannot be overly high, so as to prevent the protective layer 28 from being etched through. The suitable temperature range is from 50° C. to 200° C.

Since the protective layer 28 has been formed on the substrate 10 in the NMOS area 14b, the surface of the substrate 10 in the NMOS area 14b is protected from damages in removal of the disposable layer 30.

Figure 5:
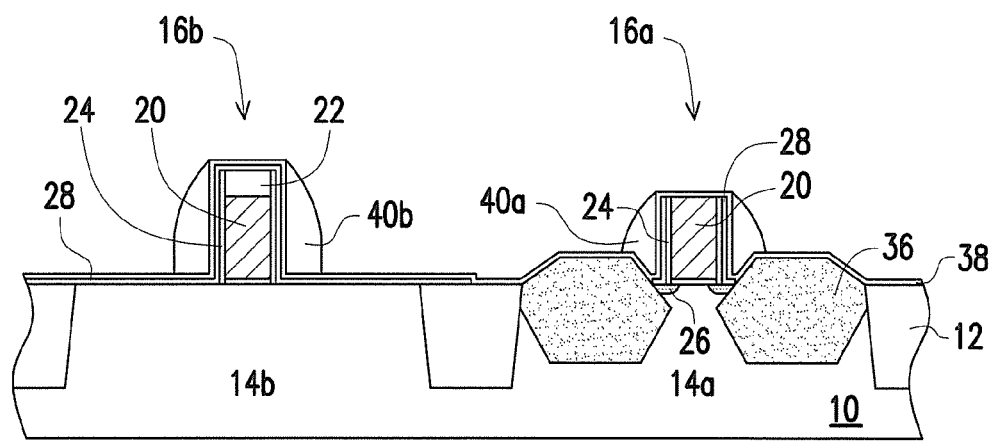

Referring to FIG. 5, a thin dummy oxide layer 38 is formed covering the above resulting structure, and then a dummy spacer 40a/b is formed on the sidewall of each gate structure 16a/b, wherein the stress layer 36 is protected by the dummy oxide layer 38 in the anisotropic etching (not shown) for forming the dummy spacer 40a/b. The dummy oxide layer 38 may have a thickness of 50 to 200 Å. The dummy spacer 40a/b may include SiN.

Figure 6:
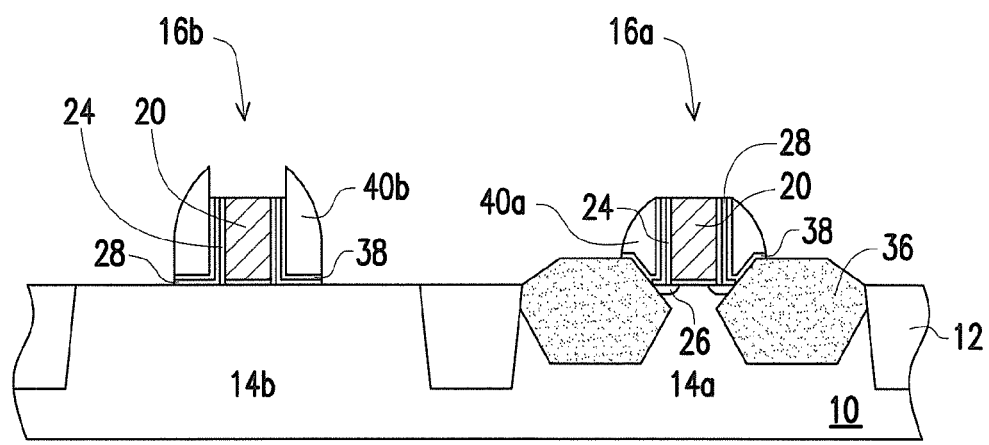

Referring to FIG. 6, the dummy oxide layer 38 exposed outside of the dummy spacer 40a/b, the protective layer 28 on the cap layer 22 of the NMOS gate structure 16b, and the cap layer 22 of the NMOS gate structure 16b are removed in sequence.

Figure 7:
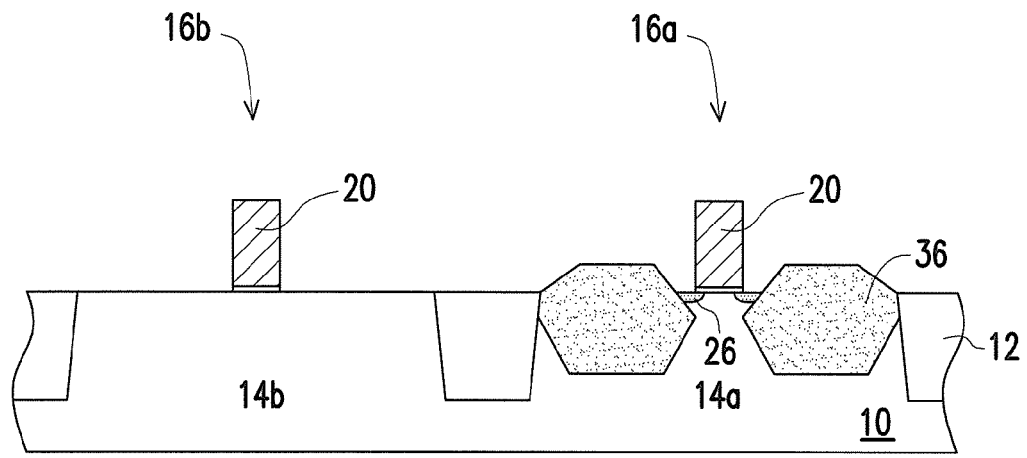

Referring to FIG. 7, the dummy spacer 40a/b, the remaining dummy oxide layer 38 and the remaining protective layer 28 are removed. The spacer 24 having been damaged by the at least one wet etching process is also removed, possibly using HF. It is noted that the temperature set in the removal process cannot be overly low, so as to prevent an etching residue. The suitable temperature range is 20° C. to 50° C.

Figure 8:
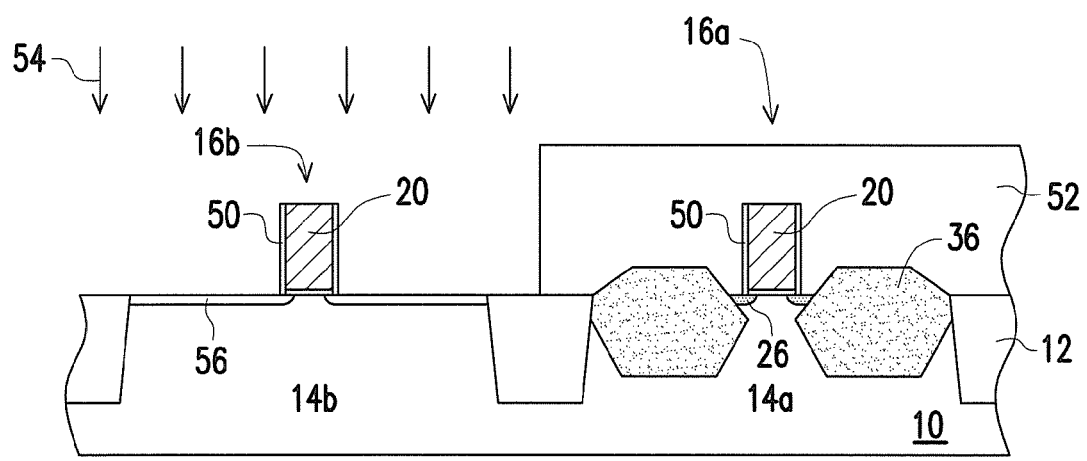

Referring to FIG. 8, a new spacer 50 is formed on the sidewall of each of the gate structures 16a and 16b. The spacer 50 may be composed of a silicon oxide spacer and a SiCN spacer. In such a case, the process for forming the spacer 50 may include: forming a silicon oxide spacer on the sidewall of each of the gate structures 16a and 16b, and forming a SiCN spacer on the sidewall of the silicon oxide spacer.

A patterned photoresist layer 52 is then formed covering the PMOS area 14a, and then N-type ion implantation 54 is performed using the patterned photoresist layer 52, the NMOS gate structure 16b and the spacer 50 as a mask to form S/D extensions 56 in the substrate 10 beside the NMOS gate structure 16b in the NMOS area 14b.

Because the newly formed spacer 50 is formed on the sidewall of the NMOS gate structure 16b to replace the precedent spacer 24 having been damaged by etching, the overlap width of the NMOS gate structure 16b and the S/D extension 56 of the NMOS can be well controlled to improve the uniformity of the devices.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for fabricating a semiconductor device, comprising:

providing a semiconductor substrate, wherein substrate has a first area and a second area;
forming a first gate structure and a second gate structure over the substrate in the first area and the substrate in the second area, respectively;
forming a first spacer on a sidewall of each of the first and the second gate structures;
performing at least one etching process including at least one wet etching process;
removing the first spacer;
forming a second spacer on a sidewall of each of the first and the second gate structures;
forming a mask layer in the second area;
performing ion implantation using the mask layer, the first gate structure and the second spacer as a mask to form S/D extensions in the substrate beside the first gate structure in the first area; and
removing the mask layer.

2. The method of claim 1, wherein forming the second spacer comprises:
forming a silicon oxide spacer on the sidewall of each of the first and the second gate structures; and
forming a silicon carbonitride (SiCN) spacer on a sidewall of the silicon oxide spacer.

3. The method of claim 1, further comprising, before the first spacer is removed,
forming a stress layer in the substrate beside the second gate structure in the second area.

4. The method of claim 3, wherein forming the stress layer comprises:
forming cavities in the substrate beside the second gate structure in the second area;
performing the at least one wet etching process to laterally expand each of the cavities; and
forming, in each of the cavities, a semiconductor material different from a material of the substrate.

5. The method of claim 3, wherein the second gate structure is a part of a PMOS transistor, and the stress layer comprises SiGe.

6. The method of claim 3, further comprising, after the stress layer is formed but before the first spacer is removed,
forming, in the first area and the second area, a dummy oxide layer covering the first gate structure, the second gate structure, the first spacer and the stress layer;
forming a dummy spacer on a sidewall of the dummy oxide layer on the sidewall of each of the first gate structure and the second gate structure;
performing the at least one wet etching process to remove a portion of the dummy oxide layer not covered by the dummy spacer and remove a cap layer of the first gate structure; and
removing the dummy spacer and the dummy oxide layer.

7. The method of claim 6, wherein the dummy spacer comprises SiN.

8. The method of claim 6, further comprising:
forming, in the first area, a protective layer and a disposable layer after the first spacer is formed but before the stress layer is formed; and
performing another wet etching process to remove the disposable layer after the stress layer is formed but before the dummy oxide layer is formed.

9. The method of claim 8, wherein forming the protective layer and the disposable layer in the first area comprises:
forming a first blanket precursor layer of the protective layer and a second blanket precursor layer of the disposable layer in the first area and the second area;

forming a patterned photoresist layer covering the first area; and anisotropically etching the first blanket precursor layer and the second blanket precursor layer using the patterned photoresist layer as a mask, wherein, in addition to the protective layer and the disposable layer, a disposable spacer is also formed, from the second blanket precursor layer, on the sidewall of the second gate structure in the second area.

10. The method of claim 8, wherein the protective layer comprises silicon oxide, and the disposable layer comprises SiN.

11. The method of claim 1, wherein the first gate structure is a part of a NMOS transistor and the second gate structure is a part of a PMOS transistor.

12. The method of claim 1, wherein the first gate structure is a part of a PMOS transistor and the second gate structure is a part of a NMOS transistor.

\* \* \* \* \*